US012563679B2

(12) United States Patent
Ney et al.

(10) Patent No.: US 12,563,679 B2
(45) Date of Patent: Feb. 24, 2026

(54) MODULAR ELECTRICAL CIRCUIT CARRIER FOR VEHICLE LATCH AND VEHICLE LATCH WITH MODULAR ELECTRICAL CIRCUIT CARRIER

(71) Applicant: Inteva Products, LLC, Troy, MI (US)

(72) Inventors: Daniel Alexander Ney, Lake Orion, MI (US); Adam Mather, Bloomfield Hills, MI (US); Donald Michael Perkins, Warren, MI (US)

(73) Assignee: INTEVA PRODUCTS, LLC, Troy, MI (US)

( * ) Notice: Subject to any disclaimer, the term of this patent is extended or adjusted under 35 U.S.C. 154(b) by 772 days.

(21) Appl. No.: 16/831,170

(22) Filed: Mar. 26, 2020

(65) Prior Publication Data

US 2020/0315040 A1 Oct. 1, 2020

Related U.S. Application Data

(60) Provisional application No. 62/825,971, filed on Mar. 29, 2019.

(51) Int. Cl.
*H05K 5/00* (2025.01)
*B60R 16/00* (2006.01)
(Continued)

(52) U.S. Cl.
CPC ......... *H05K 5/0065* (2013.01); *B60R 16/005* (2013.01); *B60R 16/0231* (2013.01); (Continued)

(58) Field of Classification Search
CPC .. H05K 5/0065; H05K 5/0056; H05K 5/0069; H05K 1/18; H05K 2201/10015; (Continued)

(56) References Cited

U.S. PATENT DOCUMENTS 7,202,431 B2 4/2007 Gauzin
9,725,929 B2 8/2017 Picard
(Continued)

FOREIGN PATENT DOCUMENTS

CN 1639817 A 7/2005
CN 102170765 A 8/2011
(Continued)

OTHER PUBLICATIONS

Chinese Office Action for Application No. 202010229311.0; Date Issued: Feb. 23, 2021.
(Continued)

*Primary Examiner* — Rockshana D Chowdhury
(74) *Attorney, Agent, or Firm* — CANTOR COLBURN LLP

(57) ABSTRACT

A modular electrical circuit carrier (ECC) configured to be directly secured to an exterior surface of a vehicle latch housing, the modular electrical circuit carrier (ECC) including: a housing; a printed circuit board located within the housing, the printed circuit board having a connector configured for securement with a wire harness connector and a series of connectors, wherein the printed circuit board includes a microprocessor capable of operating as a latch controller, wherein the housing and the series of connectors are configured for direct securement to the exterior surface of the vehicle latch housing.

18 Claims, 14 Drawing Sheets

(51) Int. Cl.

| | | |
|---|---|---|
| *B60R 16/023* | (2006.01) | |
| *E05B 81/54* | (2014.01) | |
| *B60R 16/033* | (2006.01) | |
| *H01R 25/00* | (2006.01) | |
| *H05K 1/18* | (2006.01) | |

(52) U.S. Cl.
CPC .......... *B60R 16/0239* (2013.01); *E05B 81/54* (2013.01); *H05K 5/0056* (2013.01); *H05K 5/0069* (2013.01); *B60R 16/033* (2013.01); *H01R 25/006* (2013.01); *H05K 1/18* (2013.01); *H05K 2201/10015* (2013.01); *H05K 2201/10037* (2013.01)

(58) Field of Classification Search
CPC .......... H05K 2201/10037; H05K 2201/10189; H05K 2201/10303; H05K 1/184; B60R 16/005; B60R 16/0231; B60R 16/0239; B60R 16/033; E05B 81/54; E05B 85/02; E05B 79/00; H01R 25/006

See application file for complete search history.

(56) References Cited

U.S. PATENT DOCUMENTS

| | | | |
|---|---|---|---|
| 10,047,547 B2 | 8/2018 | Zeabari | |
| 10,047,548 B2 | 8/2018 | Zeabari | |
| 2007/0167040 A1 | 7/2007 | Ogawa et al. | |
| 2012/0186312 A1 | 7/2012 | Lowder et al. | |
| 2015/0361694 A1* | 12/2015 | Zeabari | ................... E05B 81/54 |
| | | | 361/752 |

| | | | | |
|---|---|---|---|---|
| 2016/0230426 A1* | 8/2016 | Taurasi | ................... | E05B 77/34 |
| 2019/0284849 A1* | 9/2019 | Ilea | ......................... | E05B 81/54 |
| 2020/0224464 A1* | 7/2020 | Cumbo | ................... | E05B 81/16 |
| 2020/0386016 A1* | 12/2020 | Graute | ................... | E05B 81/04 |

FOREIGN PATENT DOCUMENTS

| | | |
|---|---|---|
| CN | 102498254 A | 6/2012 |
| CN | 104602443 A | 5/2015 |
| CN | 105525808 A | 4/2016 |

OTHER PUBLICATIONS

Chinese Office Action for Application No. 202020429941.8; Date Issued: Mar. 1, 2021.
Chinese Office Action for Application No. 202020429941.8; Date Issued: Nov. 10, 2020.
English Translation to Chinese Office Action for Application No. 202010229311.0; Date Issued: Feb. 23, 2021.
Second China Office Action for China Application No. 202010229311.0; Application Filing Date: Mar. 27, 2020; Date of Action: Aug. 17, 2021; 6 pages.
Third Chinese Office Action Issued Jan. 25, 2022 for Application No. 202010229311.0.
Translation of Third Chinese Office Action Issued Jan. 25, 2022 for Application No. 202010229311.0.
Chinese Decision of Rejection for Chinese Application No. 202010229311.0 Issued May 27, 2022, 7 Pages.
CNIPA Notification of Reexamination corresponding to CN Application No. 202010229311.0; Issue date, Sep. 10, 2025, 22 pages.

* cited by examiner

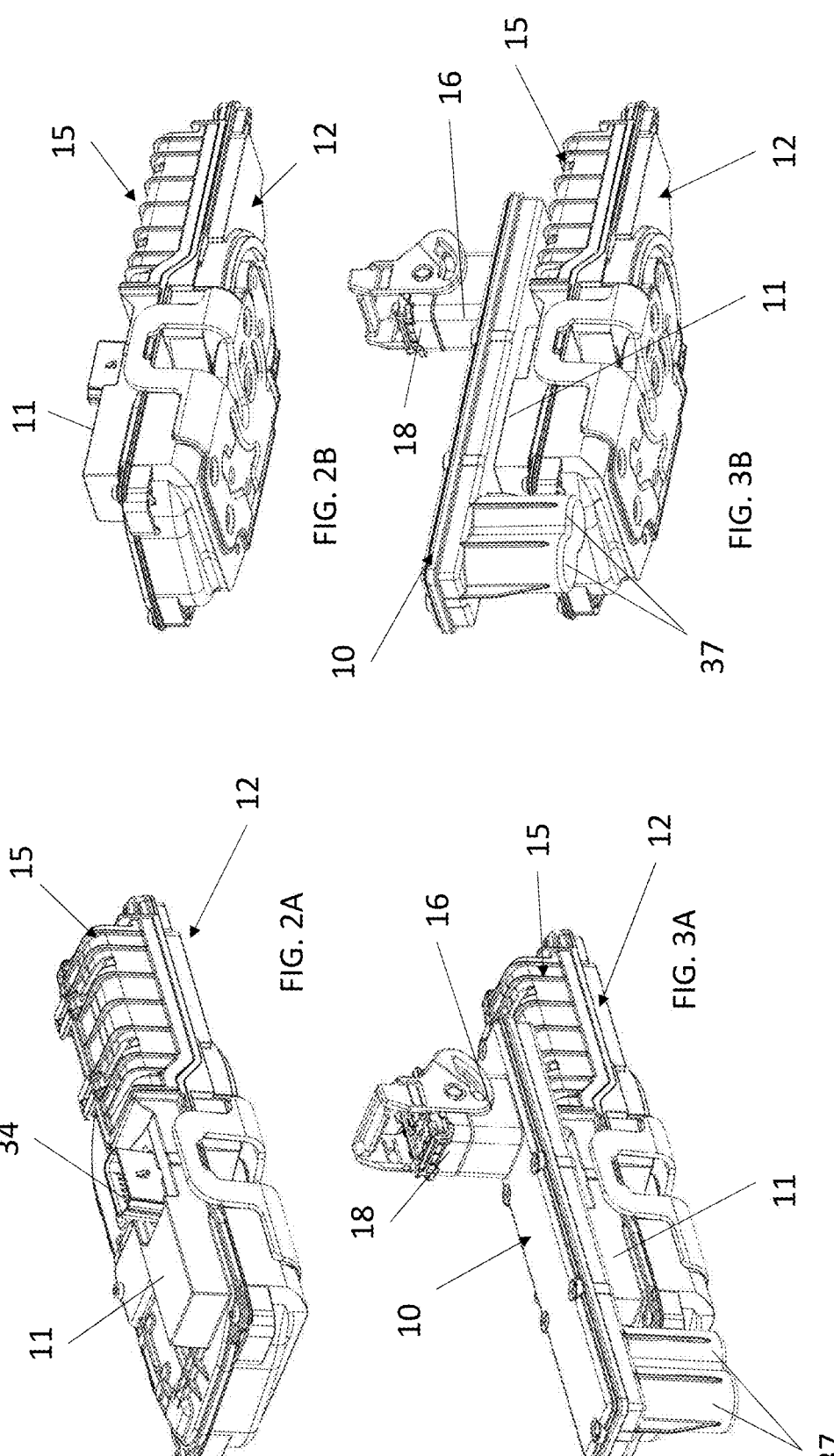

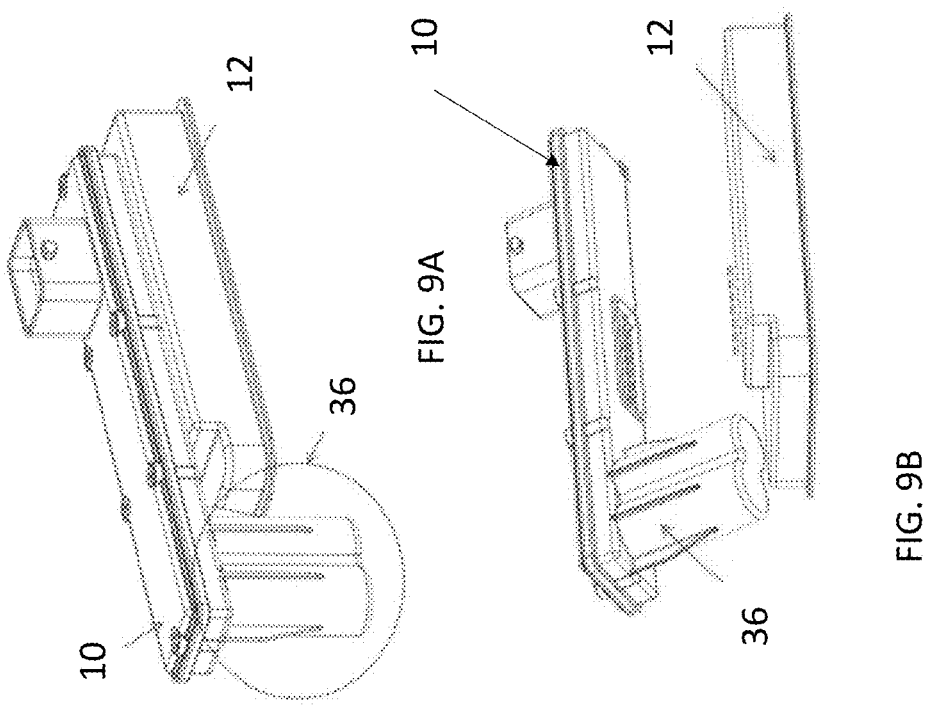
FIG. 9A
FIG. 9B
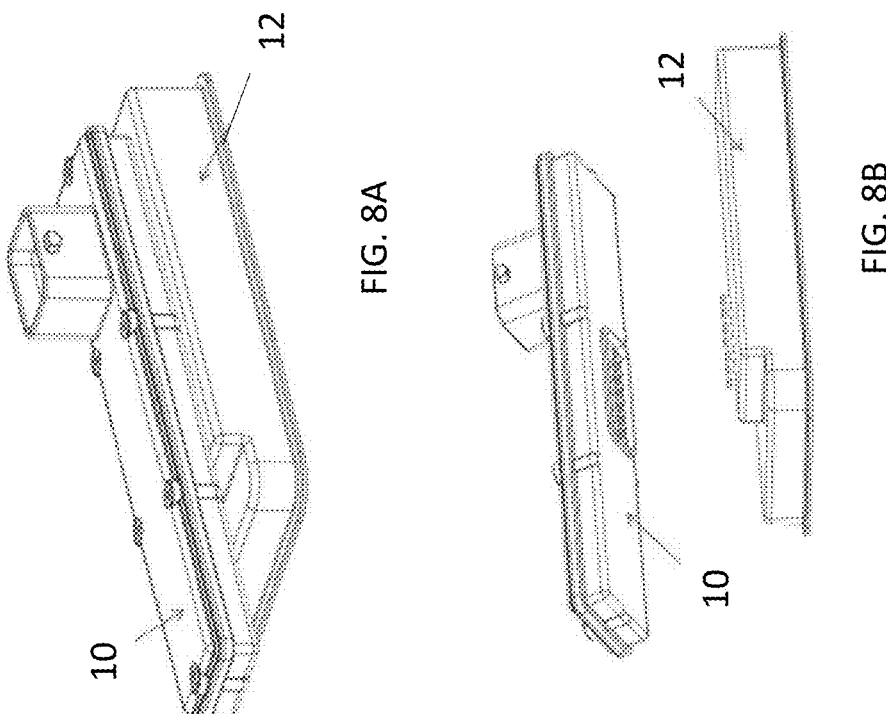
FIG. 8A
FIG. 8B

MODULAR ELECTRICAL CIRCUIT CARRIER FOR VEHICLE LATCH AND VEHICLE LATCH WITH MODULAR ELECTRICAL CIRCUIT CARRIER

CROSS REFERENCE TO RELATED PATENT APPLICATIONS

This application claims the benefit of U.S. Provisional Patent Application No. 62/825,971 filed on Mar. 29, 2019, the entire contents of which is incorporated herein by reference thereto.

BACKGROUND

Exemplary embodiments of the present disclosure pertain to the art of vehicle latches and more particularly, an electrical circuit carrier for a vehicle latch and a vehicle latch with a modular electrical circuit carrier.

Electronic latches or E-Latches, or Smart Latches, require a very technical and sensitive circuit board to properly function the latch in all scenarios. For example, these latches employ electronically operated motors or actuators that perform functions of the latch, which in the past were manually operated through the use of cables and/or handles mechanically coupled to the latch. There are also many other actuators and modules that may be required for the latch and door system to function as well, such as cinch actuators, lockout actuators, door presenters, etc. Since these latches remove the release cables that allow for mechanical release of the system, it is critical that the circuit board will function at all times and can survive all conditions. One solution is to have the electrical circuit carrier installed or mounted inside the latch, which typically requires a specific electrical circuit carrier (ECC) design for different latches, projects or applications, or to mount the electrical circuit carrier (ECC) elsewhere in the door that is remote from the latch and connect it to the latch via a wire harness. This becomes very expensive, due to the additional development, and required verification and testing of the systems, along with additional connectors, wires, etc. Moreover, the remoteness of the ECC may create issues if the vehicle door is damaged due to a collision and the wire harness is severed. These unique designs specific to one vehicle door platform also reduces the chances for serviceability, since the ECC is internal to the latch, which can become costly with the price of these systems.

There also becomes the need for versatility. Most customers will have different levels of latching systems across their different platforms based on the vehicle's requirements or features. For example, the base vehicle may use a standard E-release latch, the mid-tier vehicle may use an E-Latch with optional cinching capabilities, and the high-end vehicle may use an E-Latch with cinching, a door presenter, door closer, and power backup system. With the difference in complexity of the ECCs to control all of these features and along with the large variation in the mechanical design of the systems, it can become very costly to develop all of the various pairings of E-latches with integral ECCs for all of these options, for all doors of the vehicle.

Accordingly, it is desirable to provide an improved electrical circuit carrier (ECC) that can be used with numerous vehicle latches in order to provide a variety of control options for a variety of features desired for the latch it is intended to be used with.

BRIEF DESCRIPTION

Disclosed is a modular electrical circuit carrier (ECC) configured to be directly secured to an exterior surface of a vehicle latch housing, the modular electrical circuit carrier (ECC) including: a housing; a printed circuit board located within the housing, the printed circuit board having a connector configured for securement with a wire harness connector and a series of connectors, wherein the printed circuit board includes a microprocessor capable of operating as a latch controller, wherein the housing and the series of connectors are configured for direct securement to the exterior surface of the vehicle latch housing.

In addition to one or more of the features described above, or as an alternative to any of the foregoing embodiments, the printed circuit board further comprises at least one capacitor or battery that provides backup power to the modular electrical circuit carrier.

In addition to one or more of the features described above, or as an alternative to any of the foregoing embodiments, the microprocessor is capable of operating as a door unit controller.

In addition to one or more of the features described above, or as an alternative to any of the foregoing embodiments, the microprocessor is capable of operating as a door unit controller.

In addition to one or more of the features described above, or as an alternative to any of the foregoing embodiments, the modular electrical circuit carrier (ECC) further includes a cover configured to be secured to the housing, wherein the cover seals the printed circuit board in the housing; and a seal located on a periphery of the housing, the seal being configured to prevent moisture from entering an interior of the housing when the cover is secured to the housing.

In addition to one or more of the features described above, or as an alternative to any of the foregoing embodiments, the modular electrical circuit carrier (ECC), further includes at least one additional connector header configured for integration with another module of a latch or a door system of a vehicle door the latch is secured to.

In addition to one or more of the features described above, or as an alternative to any of the foregoing embodiments, the modular electrical circuit carrier (ECC), further includes: a wire harness connector, wherein the wire harness connector interfaces with a male pin header of the printed circuit board when it is secured to the modular electrical circuit carrier.

Also disclosed is a vehicle latch and a modular electrical circuit carrier (ECC) configured to be directly secured to an exterior surface of a housing of the vehicle latch, the modular electrical circuit carrier (ECC) including: a housing; a printed circuit board located within the housing, the printed circuit board having a connector configured for securement with a wire harness connector and a series of connectors, wherein the printed circuit board includes a microprocessor capable of operating as a latch controller, wherein the housing and the series of connectors are configured for direct securement to the exterior surface of the housing of the vehicle latch.

In addition to one or more of the features described above, or as an alternative to any of the foregoing embodiments, the vehicle latch is a common latch design configured for use as a non-electronic-latch without the electrical circuit carrier (ECC) and the vehicle latch is converted to an electronic-latch when the electrical circuit carrier (ECC) is secured thereto.

In addition to one or more of the features described above, or as an alternative to any of the foregoing embodiments, wherein the vehicle latch is a common latch design configured for use as a non-electronic-latch without the electrical circuit carrier (ECC) as anyone of: a driver's side door latch; a passenger's side door latch; a rear passenger's side door latch; and a rear driver's side door latch without the electrical circuit carrier (ECC) and the vehicle latch is converted to an electronic-latch when the electrical circuit carrier (ECC) is secured thereto.

In addition to one or more of the features described above, or as an alternative to any of the foregoing embodiments, the printed circuit board further comprises at least one capacitor or battery that provides backup power to the modular electrical circuit carrier.

In addition to one or more of the features described above, or as an alternative to any of the foregoing embodiments, the microprocessor is capable of operating as a door unit controller.

In addition to one or more of the features described above, or as an alternative to any of the foregoing embodiments, the microprocessor is capable of operating as a door unit controller.

In addition to one or more of the features described above, or as an alternative to any of the foregoing embodiments, the microprocessor is capable of operating as a door unit controller.

In addition to one or more of the features described above, or as an alternative to any of the foregoing embodiments, the microprocessor is capable of operating as a door unit controller.

In addition to one or more of the features described above, or as an alternative to any of the foregoing embodiments, the modular electrical circuit carrier (ECC) further includes a cover configured to be secured to the housing, wherein the cover seals the printed circuit board in the housing; and a seal located on a periphery of the housing, the seal being configured to prevent moisture from entering an interior of the housing when the cover is secured to the housing.

In addition to one or more of the features described above, or as an alternative to any of the foregoing embodiments, the housing and the cover are formed from plastic.

In addition to one or more of the features described above, or as an alternative to any of the foregoing embodiments, the modular electrical circuit carrier (ECC) further includes: a wire harness connector, wherein the harness connector interfaces with a male pin header of the printed circuit board when it is secured to the modular electrical circuit carrier.

Also disclosed is a method of converting a non-electronic-latch for a vehicle into an electronic-latch for a vehicle, the method including the steps of: providing the non-electronic-latch; providing a modular electrical circuit carrier (ECC) configured to be secured to an exterior surface of a housing of the non-electronic-latch, the modular electrical circuit carrier including: a housing; a printed circuit board located within the housing, the printed circuit board having a connector configured for securement with a wire harness connector and a series of connectors, wherein the printed circuit board includes a microprocessor capable of operating as a latch controller, wherein the housing and the series of connectors are configured for direct securement to the exterior surface of the housing of the non-electronic-latch.

In addition to one or more of the features described above, or as an alternative to any of the foregoing embodiments, the microprocessor is capable of operating as a door unit controller.

BRIEF DESCRIPTION OF THE DRAWINGS

The following descriptions should not be considered limiting in any way. With reference to the accompanying drawings, like elements are numbered alike:

FIGS. 2A-2B are perspective views of a vehicle latch without a modular electrical circuit carrier (ECC) attached thereto;

FIGS. 3A-3B are perspective views of the vehicle latch of FIGS. 2A-2B with a modular electrical circuit carrier (ECC) attached thereto;

FIGS. 8A and 8B illustrate one configuration of an electrical circuit carrier in accordance with the present disclosure;

FIGS. 9A and 9B illustrate another configuration of an electrical circuit carrier in accordance with the present disclosure;

DETAILED DESCRIPTION

Figures 1A, 1B, 1C:
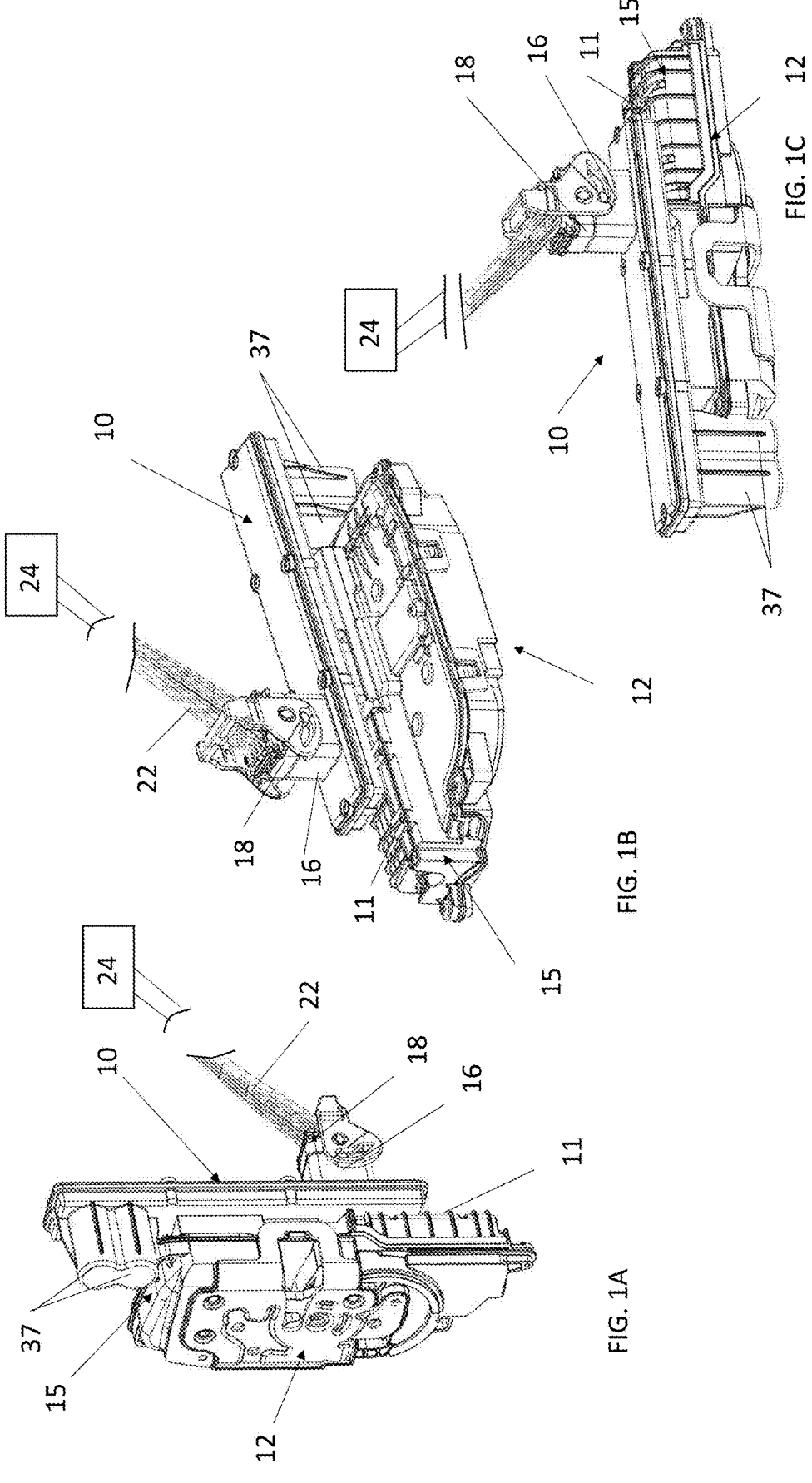
FIGS. 1A-1C are perspective views of a vehicle latch with a modular electrical circuit carrier (ECC) attached thereto.

As will be described herein and in at least one embodiment of the present disclosure a modular electrical circuit carrier (ECC) assembly is provided. In one embodiment, the modular electrical circuit carrier (ECC) assembly may be referred to as comprising a sealed housing and cover with a circuit board located therein. The circuit board will comprise electronics that are configured to communicate and control the latch and in other embodiments other components of the vehicle, which may be located in the door of the vehicle or elsewhere. As such, a modular electrical circuit carrier (ECC) assembly is provided that can attach to and communicate with a latch. The modular electrical circuit carrier (ECC) assembly will negate the need to directly mount an electrical circuit carrier (ECC) and its associated electronics inside the housing of the latch, or to design individual latches with specific ECCs intended for different projects or applications.

In accordance with various embodiments of the present disclosure a common ECC assembly design is provided that allows it to integrate with a variety of different latching systems, and provides the ability to use a common ECC assembly for a front, rear, driver side, passenger side, compartmental latches, or common to all door applications.

Another feature of the present disclosure is to provide a common mechanical latch design for use as a standard latch (e.g., non-E-Latch) and an E-Latch. By designing the ECC to be a modular "add-on", the mechanical latch it is used with can simply be a standard latch design, which allows for it to be a common mechanical system across all platforms. Once the ECC assembly is added to the standard latch the ECC assembly can change it to a smart latch. For example, an end user simply attaches desired ECC assembly for a particular platform (e.g., E-Latch controls, power backup, cinching controls, etc.) and converts the standard latch to a smart or E-Latch for the desired platform (e.g., E-Latch controls, power backup, cinching controls, etc.).

The ECC's circuit board itself can provide a variety of different options for the system, whether it is providing just the standard controls for an E-Latch, or controlling the other modules of, and around, the latch such as cinching actuators, lockout actuators, door presenters, or even all the functionality of the door control unit (DCU). Using this logic, an end user can obtain a single ECC assembly design with the functions they require, and they can use the same ECC assembly on all, or multiple, doors of the vehicle.

In one embodiment, the ECC assembly is a modular component that can attach onto any latching system and communicate with the signals that it receives from the latch. In one implementation, the ECC assembly comes in a sealed housing and cover, with two or more molded in connector headers that attach to the latch assembly, the harness from the vehicle, and any other modules that are applicable. The advantages of this type of modular system are that one common latching assembly can be used between an E-Latch and non-E-Latch, and as few as one common ECC can be used for all doors of the vehicle. Moreover, the ECC assembly is serviceable without replacing the entire latch since it can be removed from the latch. In addition, the ECC assembly can be produced in large volumes which allows for further cost efficiencies. Still further, one common design reduces variation between each ECC assembly in the vehicle, and between vehicle platforms.

For non-E-Latches, a modular connector can be used in place of the ECC assembly (if the latch design does not come with a standard connector for a wire harness). Use of the modular connector means that the latch can meet different customer's connector requirements, without required changes to the latch assembly.

This type of system can be implemented onto any latch type within the vehicle, such as side door, liftgate, compartmental, hood, truck, frunk (e.g., a storage compartment located at the front of the vehicle), etc.

As mentioned above, a common modular electrical circuit carrier (ECC) or electrical circuit carrier (ECC) or electrical circuit carrier (ECC) assembly or (ECC) is designed to integrate with a variety of different latching systems. This provides the ability to use a common electrical circuit carrier (ECC) for left hand (LH) latches, right hand (RH) latches for use in front or rear door applications as well as a liftgate latch, a compartmental latch, a hood latch, a truck latch, a frunk latch, as well as any other suitable application that requires a latch capable of being used with aforementioned ECC.

Another feature of this disclosure is to use a common latch design for both a regular latch (non E-Latch) and an E-Latch. As such, the ECC can be a modular component that can attach onto any latching system or latch and communicate with the signals that it receives from the latch. As such, the modular ECC may be applied to numerous latch designs thereby providing many design options since the modular ECC may be swapped out from one latch and provided with another ECC such that the operation of the latch can be reconfigured by simply removing and replacing the ECC. In addition and in one embodiment, the common latch design is a common latch design configured for use as a non-electronic-latch without the electrical circuit carrier (ECC) and the vehicle latch is converted to an electronic-latch when the electrical circuit carrier (ECC) is secured thereto.

Still further and in one non-limiting embodiment, the vehicle latch is a common latch design configured for use as a non-electronic-latch without the electrical circuit carrier (ECC) as anyone of: a driver's side door latch; a passenger's side door latch; a rear passenger's side door latch; and a rear driver's side door latch without the electrical circuit carrier (ECC) and the same vehicle latch is converted to an electronic-latch when the electrical circuit carrier (ECC) is secured thereto.

In one non-limiting embodiment, the ECC and its associated electronics comes in a sealed housing and cover, with two common, handed or unhanded connector headers that attach to the latch assembly and the harness from the vehicle.

Figure 1D:
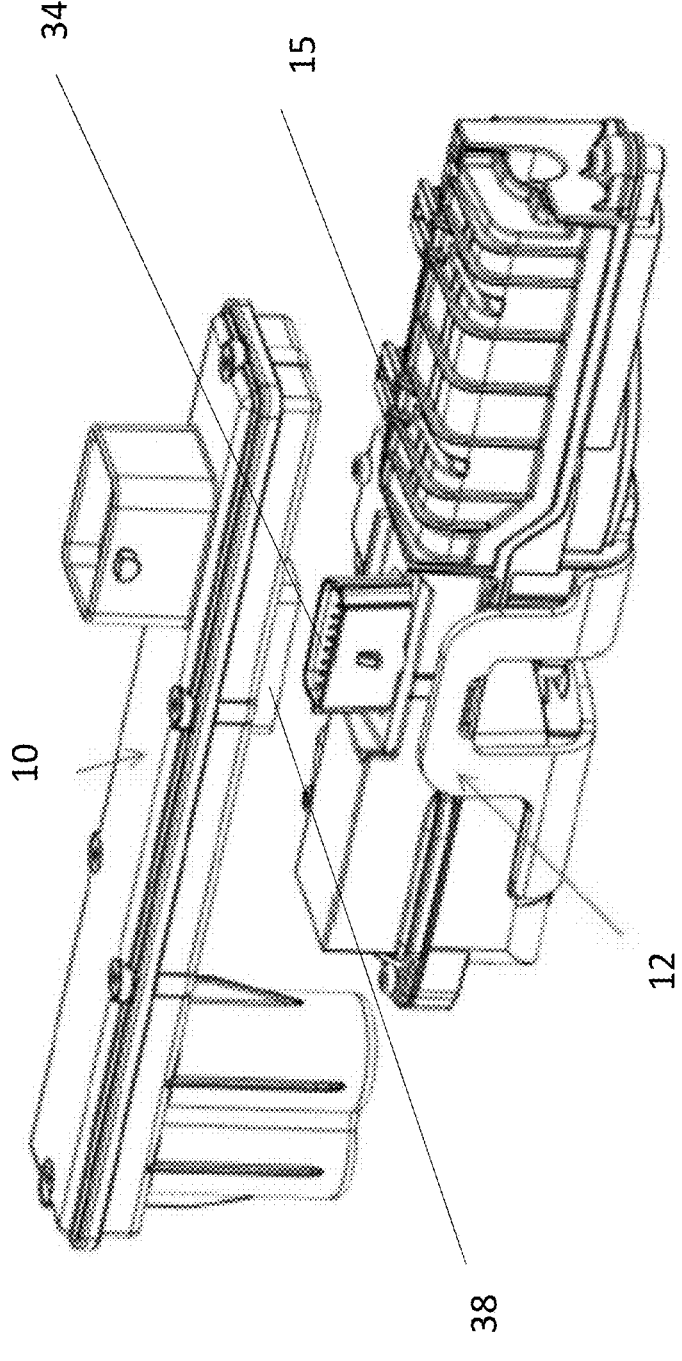
FIG. 1D illustrates the modular electrical circuit carrier (ECC) being secured to the vehicle latch.
Figure 1E:
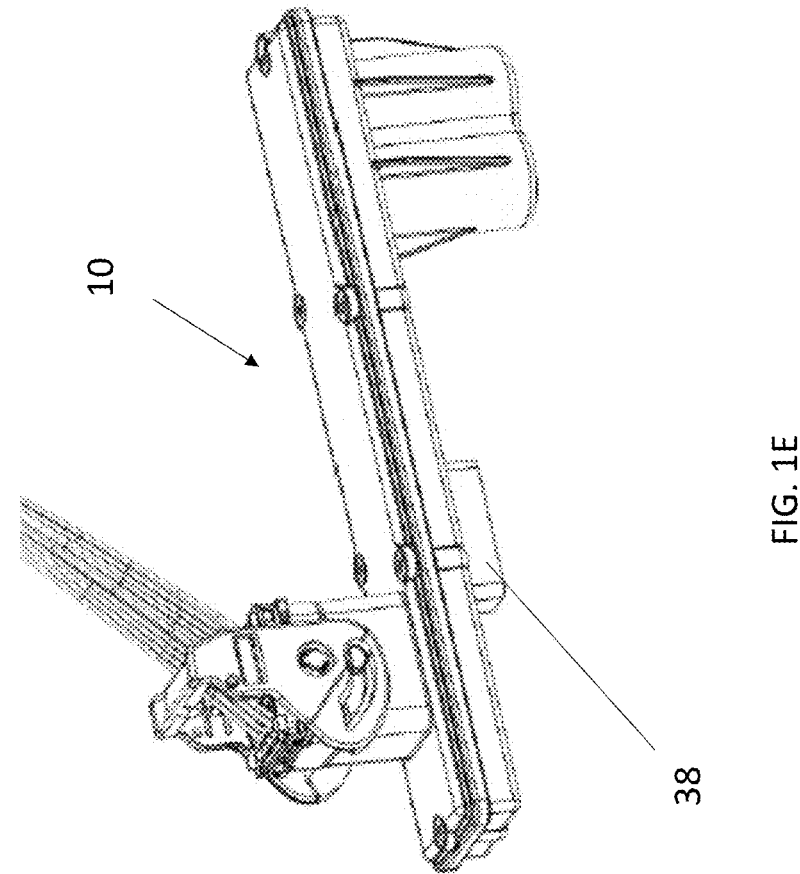
FIG. 1E is a perspective view of the modular electrical circuit carrier (ECC)

FIGS. 1A-1C illustrate a modular ECC assembly 10 or ECC 10 secured to a vehicle latch or latch assembly 12. FIG. 1D illustrates the ECC assembly 10 or ECC 10 being secured to the vehicle latch 12 FIGS. 2A and 2B are perspective views of the vehicle latch 12 without the modular ECC assembly 10 secured thereto and FIGS. 3A and 3B are perspective views of the vehicle latch 12 with the modular ECC assembly 10 secured thereto.

In one non limiting embodiment, wires 22 may be operably coupled to a vehicle door unit controller 24 (illustrated schematically in at least FIGS. 1A-1C) of a vehicle door system, which may be configured to operate other features of the door such as a window regulator, side view mirrors, lighting, etc. As will be mentioned below and in an alternative embodiment, these other features may also be controlled by the modular ECC assembly 10. Alternatively, box 24 may represent anyone of a plurality of sensors located with the vehicle, which provide operation signals to the electronics of the ECC 10.

Figure 4A:
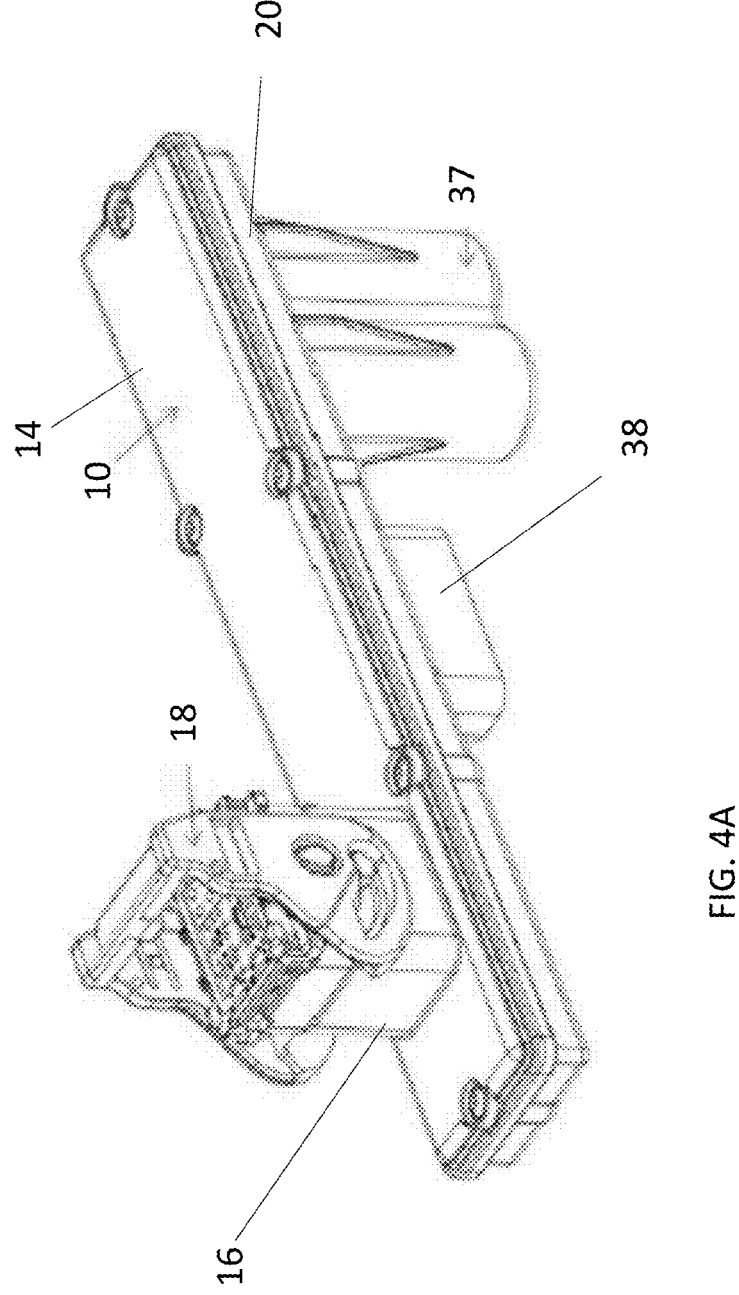
FIG. 4A is a perspective view of an electrical circuit carrier according to an embodiment of the present disclosure.
Figure 4B:
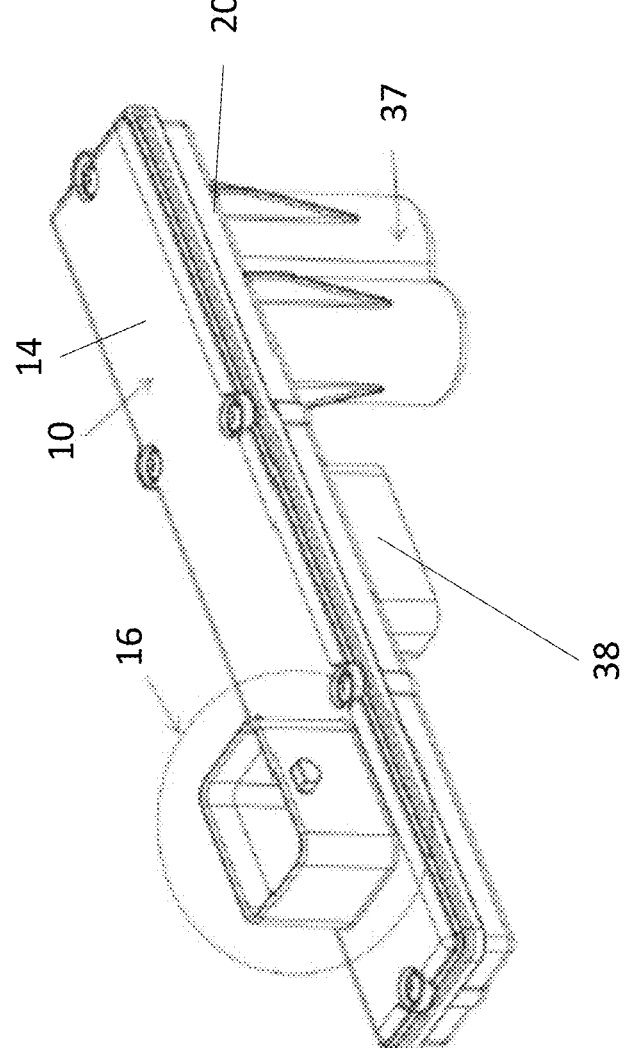
FIG. 4B is a perspective view of the electrical circuit carrier of FIG. 4A without a wire harness secured thereto.

FIGS. 4A and 4B are perspective views illustrating the modular ECC Assembly 10 or ECC 10. The modular ECC assembly 10 has a cover 14 that has a male connector interface 16 configured to couple to a harness female connector or wire harness 18, and a housing 20 that interfaces to the latch 12.

Figure 5:
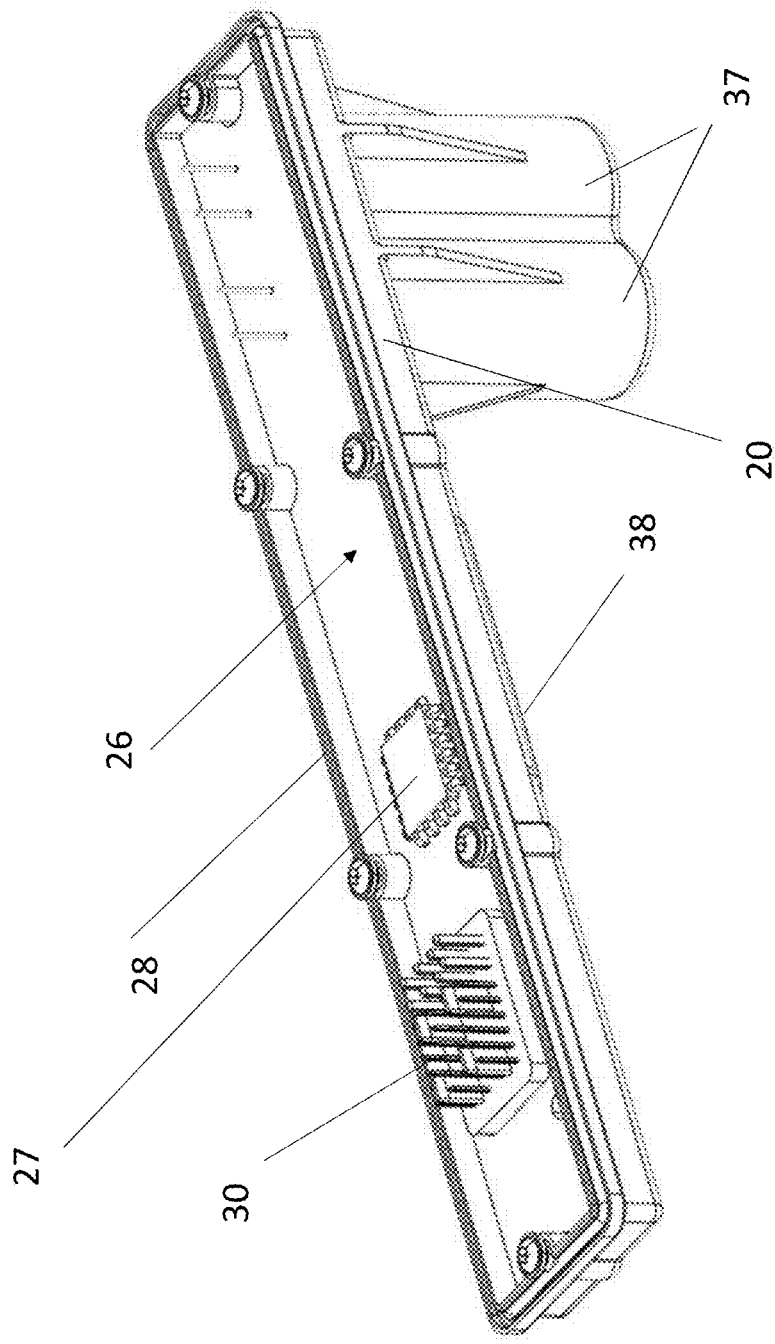
FIG. 5 is a perspective view of the electrical circuit carrier of FIG. 4A with a cover removed.

FIG. 4B illustrates the modular ECC assembly 10 without the wire harness 18. The cover's male header or male connector interface 16 interfaces and seals to the wire harness 18. FIG. 5 illustrates a printed circuit board (PCB) assembly 26 located in the housing 20 of the ECC 10. The housing 20 also features a seal 28, which keeps the printed circuit board (PCB) assembly 26 dry inside of the housing 20 of the ECC assembly 10 when the cover 14 is secured thereto. In one embodiment, the seal is located on a periphery of the housing and the seal is configured to prevent moisture from entering an interior of the housing when the cover is secured to the housing. In one embodiment, the seal may be made from any suitable material (elastomeric or otherwise) in order to provide the aforementioned sealing features.

In one non-limiting embodiment, the housing 20 and the cover 14 may be formed from an easily moldable material such as plastic or any other suitable polymeric materials.

Figures 6A, 6B:
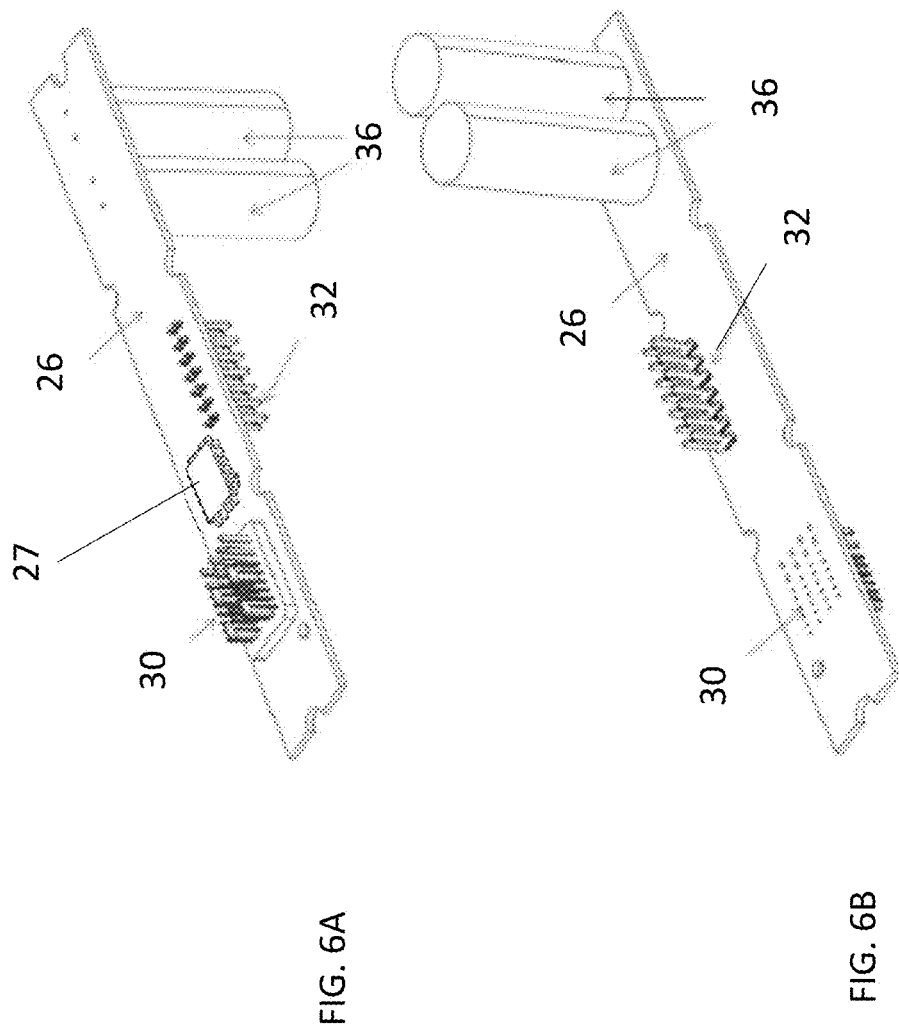
FIGS. 6A and 6B are perspective views of the printed circuit board assembly received in the electrical circuit carrier.

FIGS. 6A and 6B are perspective views of the printed circuit board (PCB) assembly 26 when it is removed from the housing 20 of the ECC assembly 10. As illustrated, the PCB assembly 26 includes a male pin header or connector 30 that interfaces with the wire harness connector 18, and a series of terminals or connectors 32 that interface with the latch 12 by engaging with a complementary connector(s) or terminal 34 of the latch 12. In one non-limiting embodiment the terminals are fork terminals 32. As illustrated and in one non-limiting embodiment, the modular ECC assembly 10 is configured to have only a single point of connection with the vehicle latch 12 via terminals or connectors 32 and connectors or terminals 34.

In one non-limiting embodiment, the male pin header 30 is located on one side of the printed circuit board and the series of fork terminals 32 are located on an opposite side of the printed circuit board. In addition and in one non-limiting alternative embodiment, the PCB assembly 26 may have two optional super capacitors 36 that will provide backup power in the event of a power loss to the vehicle the ECC assembly is installed in. In one embodiment, the PCB assembly 26 will have at least one super capacitor 36 or capacitor 36 that provides backup power to the ECC. As used herein a super capacitor is intended to refer to a high-capacity capacitor that has capacitance values much higher than other capacitors and can accept and deliver charge much faster than batteries, and can tolerate many more charge and discharge cycles than rechargeable batteries. Alternatively, a battery may be employed instead of or in combination with capacitor 36.

In one non-limiting embodiment, the housing 20 is configured to have extended portions 37 for receipt of the capacitors 36 therein.

The PCB assembly 26 will also have controller(s) or microcontroller(s) or microprocessor(s) (not shown) as well as the necessary electrical traces in order to operate the latch 12 when the ECC 10 is secured thereto and the latch is operating as an E-latch or electronic latch.

The PCB assembly 26 may also be referred to as a door latch controller 26 or latch controller 26 or electronic latch controller 26 that comprises a microprocessor, microcontroller or other equivalent processing device 27 capable of executing commands of computer readable data or program for executing a control algorithm that controls the operation of the vehicle latch 12. Moreover, the microprocessor, microcontroller or other equivalent processing device 27 is capable of being programmed in order to provide the various control features described herein (e.g., door latch controller 26 or latch controller 26 or electronic latch controller 26 and/or door unit controller 26).

In order to perform the prescribed functions and desired processing, as well as the computations therefore (e.g., the execution of fourier analysis algorithm(s), the control processes prescribed herein, and the like), the controller may include, but not be limited to, a processor(s), computer(s), memory, storage, register(s), timing, interrupt(s), communication interfaces, and input/output signal interfaces, as well as combinations comprising at least one of the foregoing. For example, the controller may include input signal filtering to enable accurate sampling and conversion or acquisitions of such signals from communications interfaces.

In addition and in other embodiments the PCB assembly 26 or door latch controller or electronic latch controller 26 may also be configured to control other features of a vehicle door to which the latch is secured to. Non-limiting examples of these features include operation of a window regulator, side view mirrors, lighting, etc. As such, the PCB assembly 26 or door latch controller 26 may also be configured to operate as door unit controller 26.

Since the PCB includes a microprocessor, microcontroller or other equivalent processing device 27 it can be programmed to execute commands of computer readable data or a program for executing a control algorithm that controls the operation of the vehicle latch and/or other components of a vehicle door the latch 12 is secured to. Therefore, the ECC 10 and the PCB 26 may be configured to serve as a hub for other vehicle door electronics in addition to the operation of the latch 12.

Figure 7:
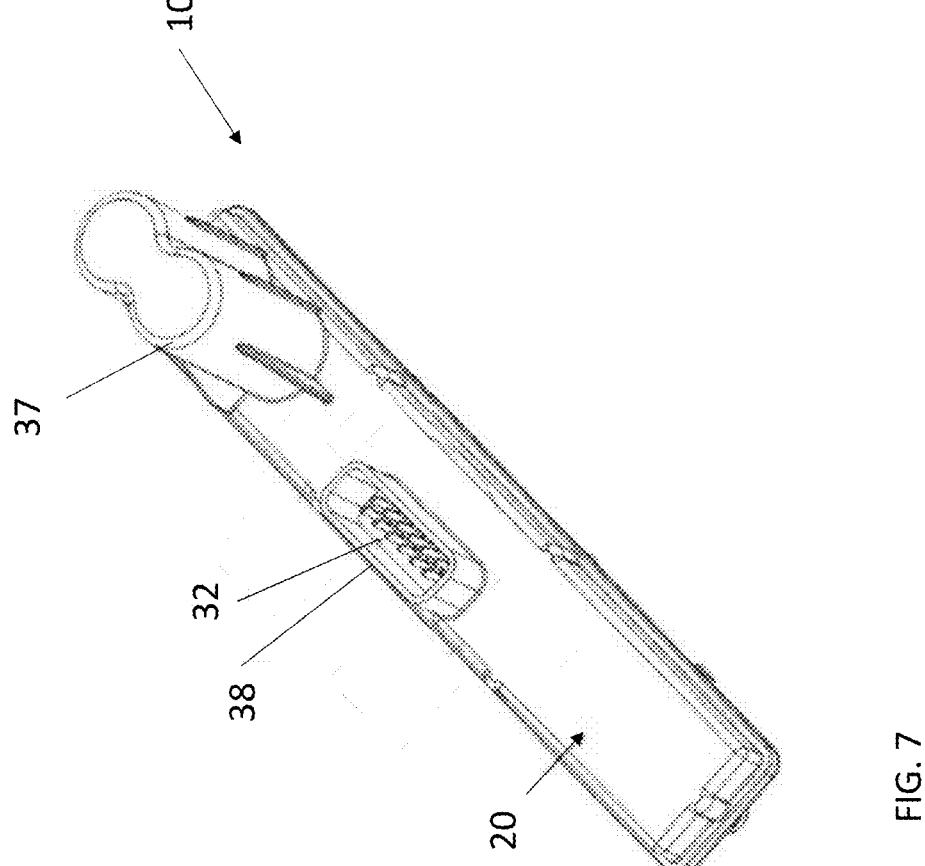
FIG. 7 is a bottom perspective view of the electrical circuit carrier.

FIG. 7 illustrates a portion of the housing 20 that interfaces with the latch 12. This portion of the housing 20 has a molded header 38 integral with the housing 20, wherein the series of fork terminals 32 are received therein and act as female pins for the latch connector(s) 34 when the ECC assembly 10 is secured to the latch 12. As such, the integrally molded header 38, the terminals or connectors 32 and the connector(s) 34 of the latch 12 allow the ECC assembly 10 to be directly secured to an exterior surface of the housing 15 of the latch.

Figure 10A:
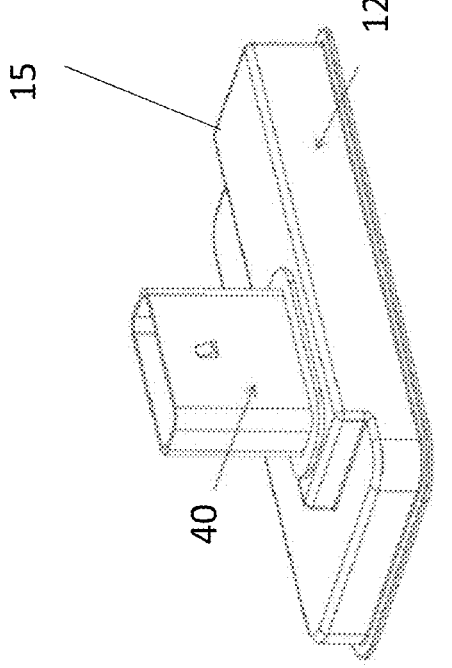
FIGS. 10A and 10B illustrate yet another configuration of an electrical circuit carrier in accordance with the present disclosure.
Figure 10B:
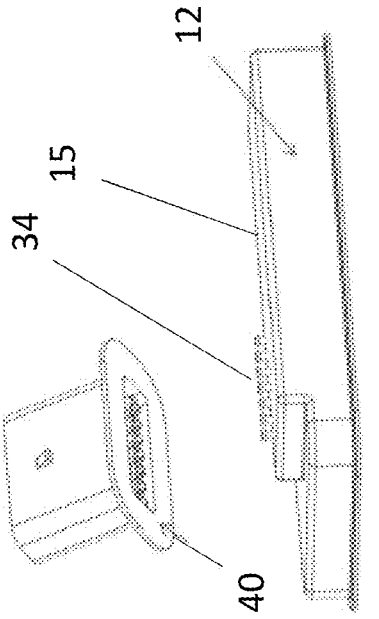

FIGS. 8A-10B illustrate three possible variations of the ECC assembly 10. FIG. 8A shows a standard ECC 10 attached to the latch 10. FIG. 8B shows the standard ECC 10 detached from the latch 10. FIGS. 9A-9B shows an ECC 10 with a power backup via the aforementioned super capacitors 36 or capacitor 36 that provides backup power to the ECC 10 attached to the latch 12. FIG. 9A shows the ECC 10 with power backup attached to the latch 12 and FIG. 9B shows the ECC 10 with power backup detached from the latch 12. FIG. 10A illustrates a modular connector 40 attached to the latch 12 for a standard latching system while FIG. 10B shows the modular connector 40 detached from the latch 12.

Figure 11:
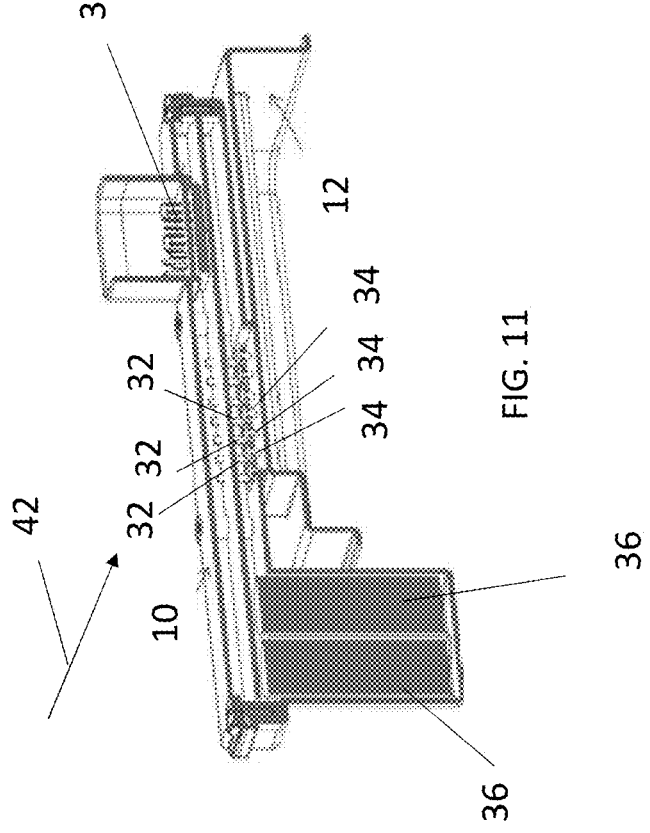

FIG. 11 illustrates one of non-limiting configuration for attaching the terminals 32 of the PCB 26 of the ECC 10 to the terminals 34 of the latch 12. In this illustrated embodiment, the ECC is assembled to the latch 12 by positioning it against the latch 12 and sliding the ECC 10 laterally with respect to the latch 12 into position until it snaps into place. The lateral direction is illustrated generally by arrow 42. The latch 12 and the ECC 10 would then use retainment and alignment features to secure the ECC 10 to the latch 12.

Figure 12:
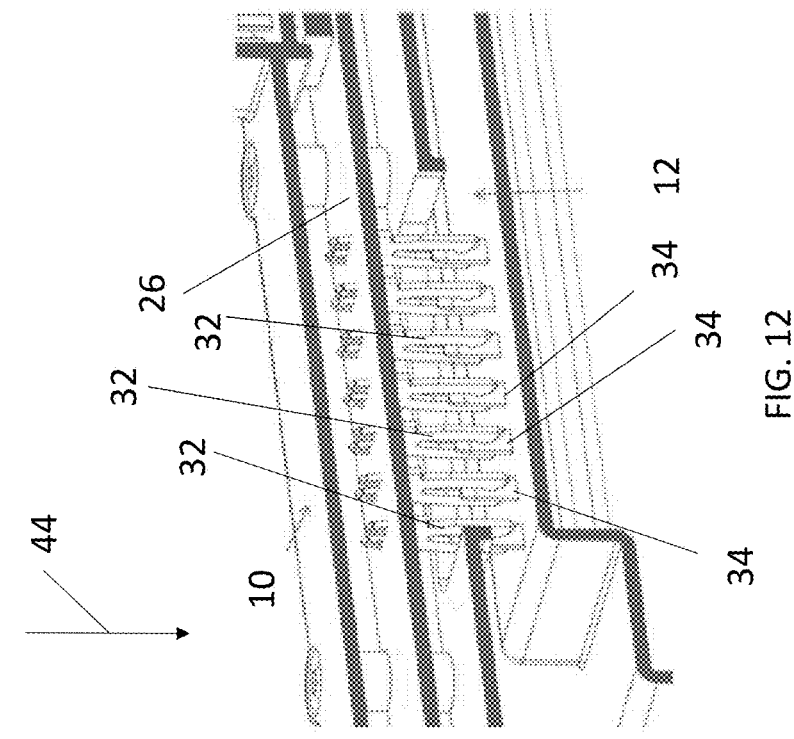
FIGS. 11 and 12 are cross-section views of the electrical circuit carrier illustrated in FIGS. 8A and 8B.

FIG. 12 shows another non-limiting configuration for attaching the terminals 32 of the ECC 10 to the terminals 34 of the latch 12. In this embodiment, the terminals 32 of the ECC 10 are fork terminals 32. This design allows for the ECC 10 to be assembled by coming straight down in the direction of arrow 44 on top off the latch until the fork terminals 32 press onto the terminals of the latch 12. The latch 12 and the ECC 10 would then use retainment and alignment features to secure the ECC 10 to the latch 12.

Figure 13:
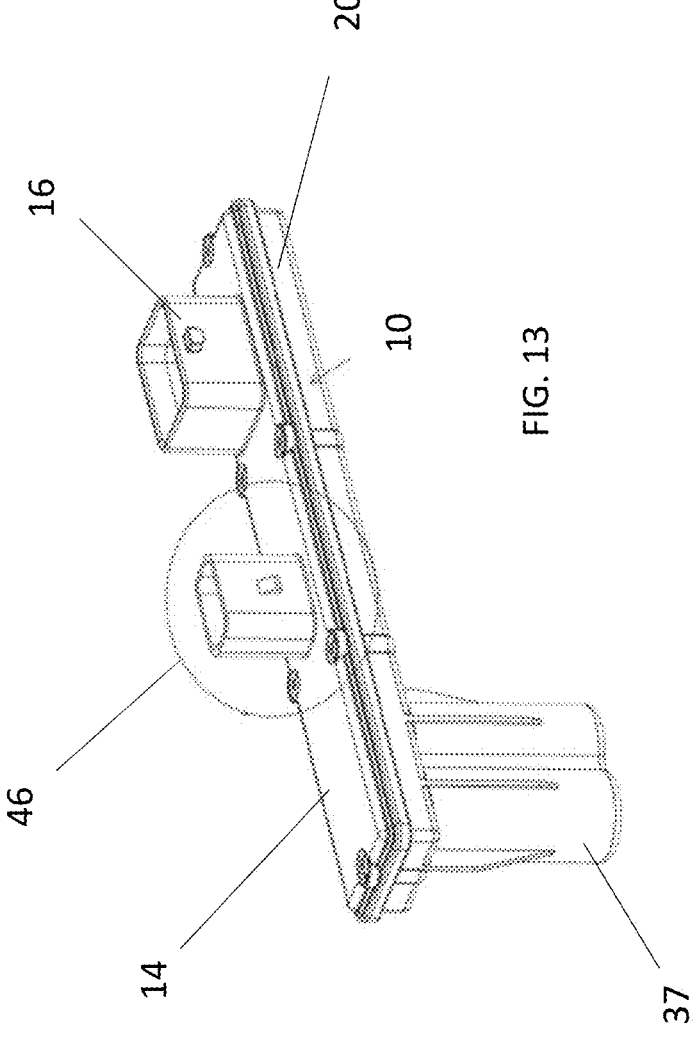
FIG. 13 illustrates yet another configuration of an electrical circuit carrier in accordance with the present disclosure.

FIG. 13 illustrates the ECC 10 according to another embodiment wherein an additional connector header 46 is provided for integration with another module (not shown) of the latch 12 or a door system of a vehicle door the latch is secured to.

Figure 14:
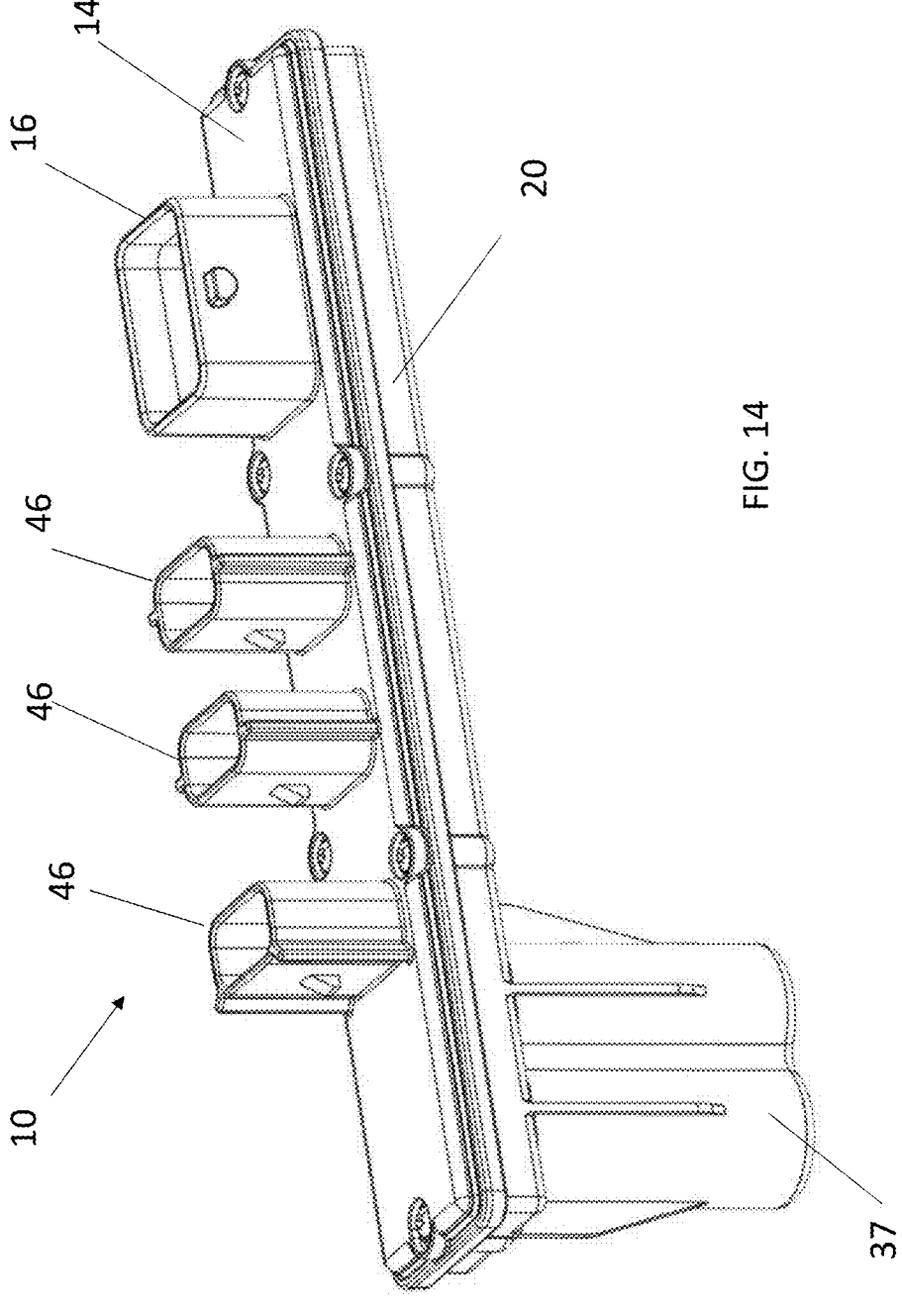
FIG. 14 illustrates yet another configuration of an electrical circuit carrier in accordance with the present disclosure.

FIG. 14 illustrates the ECC 10 according to yet another embodiment wherein multiple additional connector headers 46 are provided for integration with several other modules (not shown) of the latch 12 or a door system of a vehicle door the latch is secured to.

Accordingly and through the use of the ECC 10, a vehicle latch 12 can be converted from a non-E-latch or non-electronic latch to an E-latch or electronic simply through securement of the ECC assembly to an exterior surface 11 of a housing 15 the vehicle latch 12. This allows the ECC assembly 10 to have a common modular design configured to integrate with a variety of different latching systems.

Moreover, the latch may be common to a variety of vehicle applications making usable without the ECC or alternatively with the ECC.

As such, the common electrical circuit carrier (ECC) 10 can be used in many vehicle door applications (e.g., left hand, right hand, front, rear, etc.). Another feature of this disclosure is that a common latch design can be used for both a regular latch (non E-Latch) and an E-Latch. As such, the ECC can be a modular component that can attach onto any latching system and communicate with the signals that it receives from the latch.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A modular electrical circuit carrier configured to be directly secured to an exterior surface of a vehicle latch housing associated with a vehicle latch, the exterior surface of the vehicle latch housing enclosing components of the vehicle latch, the modular electrical circuit carrier comprising:
   a housing;
   a printed circuit board located within the housing, the printed circuit board having a connector configured for securement with a wire harness connector and a series of connectors, wherein the printed circuit board includes a microprocessor capable of operating as a latch controller, wherein the housing and the series of connectors are configured for direct securement to the exterior surface of the vehicle latch housing, the series of connectors of the printed circuit board interfacing with complementary terminals or connectors of the vehicle latch when the modular electrical circuit carrier is secured to the exterior surface of the vehicle latch housing; and
   wherein the modular electrical circuit carrier is detachably connected to the exterior surface of the vehicle latch housing, to convert the vehicle latch associated with the vehicle latch housing from a non-electronic latch to an electronic latch.

2. The modular electrical circuit carrier as in claim 1, wherein the printed circuit board further comprises at least one capacitor or battery that provides backup power to the modular electrical circuit carrier.

3. The modular electrical circuit carrier as in claim 2, wherein the microprocessor is capable of operating as a door unit controller.

4. The modular electrical circuit carrier as in claim 1, wherein the microprocessor is capable of operating as a door unit controller.

5. The modular electrical circuit carrier as in claim 1, further comprising a cover configured to be secured to the housing, wherein the cover seals the printed circuit board in the housing; and
   a seal located on a periphery of the housing, the seal being configured to prevent moisture from entering an interior of the housing when the cover is secured to the housing.

6. The modular electrical circuit carrier as in claim 1, further comprising at least one additional connector header configured for integration with another module of a latch or a door system of a vehicle door the latch is secured to.

7. The modular electrical circuit carrier as in claim 1, wherein the wire harness connector interfaces with a male pin header of the printed circuit board when it is secured to the modular electrical circuit carrier.

8. In combination, a vehicle latch and a modular electrical circuit carrier configured to be directly secured to an exterior surface of a housing of the vehicle latch, the exterior surface of the housing of the vehicle latch enclosing components of the vehicle latch, the modular electrical circuit carrier comprising:
   a housing;
   a printed circuit board located within the housing, the printed circuit board having a connector configured for securement with a wire harness connector and a series of connectors, wherein the printed circuit board includes a microprocessor capable of operating as a latch controller, wherein the housing and the series of connectors are configured for direct securement to the exterior surface of the housing of the vehicle latch, the series of connectors of the printed circuit board interfacing with complementary terminals or connectors of the vehicle latch when the modular electrical circuit carrier is secured to the exterior surface of the vehicle latch housing; and
   wherein the vehicle latch is a common latch design configured for use as a non-electronic-latch without the electrical circuit carrier and the vehicle latch is converted to an electronic-latch when the electrical circuit carrier is secured thereto.

9. The combination of claim 8, wherein the vehicle latch is anyone of: a driver's side door latch; a passenger's side door latch; a rear passenger's side door latch; and a rear driver's side door latch.

10. The combination as in claim 8, wherein the printed circuit board further comprises at least one capacitor or battery that provides backup power to the modular electrical circuit carrier.

11. The combination as in claim 8, wherein the microprocessor is capable of operating as a door unit controller.

12. The combination as in claim 9, wherein the microprocessor is capable of operating as a door unit controller.

13. The combination as in claim 10, wherein the microprocessor is capable of operating as a door unit controller.

14. The combination as in claim 8, wherein the modular electrical circuit carrier further comprising a cover configured to be secured to the housing, wherein the cover seals the printed circuit board in the housing; and a seal located on a periphery of the housing, the seal being configured to prevent moisture from entering an interior of the housing when the cover is secured to the housing.

15. The combination as in claim 14, wherein the housing and the cover are formed from plastic.

16. The combination as in claim 8, wherein the harness connector interfaces with a male pin header of the printed circuit board when it is secured to the modular electrical circuit carrier.

17. A method of converting a non-electronic-latch for a vehicle into an electronic-latch for a vehicle, comprising:

providing the non-electronic-latch;

providing a modular electrical circuit carrier configured to be detachably secured to an exterior surface of a housing of the non-electronic-latch, the exterior surface of the housing of the non-electronic-latch enclosing components of the non-electronic-latch, the modular electrical circuit carrier including: a housing; a printed circuit board located within the housing, the printed circuit board having a connector configured for securement with a wire harness connector and a series of connectors, wherein the printed circuit board includes a microprocessor capable of operating as a latch controller, wherein the housing and the series of connectors are configured for direct securement to the exterior surface of the housing of the non-electronic-latch, the series of connectors of the printed circuit board interfacing with complementary terminals or connectors of the non-electronic latch when the modular electrical circuit carrier is secured to the exterior surface of the non-electronic-latch; and converting the non-electronic latch to an electronic latch when the modular electrical circuit carrier is detachably secured to the exterior surface of the housing of the non-electronic-latch.

18. The method of claim 17, wherein the microprocessor is capable of operating as a door unit controller.

* * * * *